United States Patent
Shieh et al.

(10) Patent No.: US 9,041,223 B2
(45) Date of Patent: May 26, 2015

(54) BUMP-ON-TRACE (BOT) STRUCTURES

(75) Inventors: Yuh Chern Shieh, Taipei (TW);
Han-Ping Pu, Taichung (TW); Yu-Feng Chen, Hsinchu (TW); Tin-Hao Kuo, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 26 days.

(21) Appl. No.: 13/610,050

(22) Filed: Sep. 11, 2012

(65) Prior Publication Data

US 2013/0001778 A1    Jan. 3, 2013

Related U.S. Application Data

(63) Continuation of application No. 13/095,185, filed on Apr. 27, 2011, now Pat. No. 8,288,871.

(51) Int. Cl.
H01L 23/40 (2006.01)
H01L 23/52 (2006.01)
H01L 29/40 (2006.01)
H01L 21/00 (2006.01)
H01L 21/44 (2006.01)
H01L 23/00 (2006.01)
H01L 23/498 (2006.01)

(52) U.S. Cl.
CPC ....... H01L 24/13 (2013.01); H01L 2224/16238 (2013.01); H01L 2224/81191 (2013.01); H01L 2924/01322 (2013.01); H01L 2224/05572 (2013.01); H01L 2224/13015 (2013.01); H01L 2224/13005 (2013.01); H01L 2224/17104 (2013.01); H01L 23/49838 (2013.01); H01L 24/16 (2013.01); H01L 2224/13013 (2013.01); H01L 2224/13014 (2013.01); H01L 2224/13082 (2013.01); H01L 2224/13147 (2013.01); H01L 2224/81424 (2013.01); H01L 2224/81444 (2013.01); H01L 2224/81447 (2013.01); H01L 2224/81455 (2013.01); H01L 2224/81464 (2013.01); H01L 2224/81815 (2013.01); H01L 2224/16104 (2013.01); H01L 2224/81484 (2013.01); H01L 2224/131 (2013.01); H01L 2224/16227 (2013.01); H01L 2924/00013 (2013.01); H01L 2924/01029 (2013.01); H01L 2224/16225 (2013.01)

(58) Field of Classification Search
USPC .......... 257/778, 779, 773, 737; 438/108, 612, 438/613
See application file for complete search history.

(56) References Cited

U.S. PATENT DOCUMENTS

| | | | |
|---|---|---|---|
| 5,569,964 A * | 10/1996 | Ikebe | 257/780 |
| 6,114,751 A * | 9/2000 | Kumakura et al. | 257/666 |
| 7,713,782 B2 * | 5/2010 | Pendse | 438/108 |
| 8,207,608 B2 * | 6/2012 | Chew et al. | 257/738 |

(Continued)

*Primary Examiner* — David Zarneke
(74) *Attorney, Agent, or Firm* — Lowe Hauptman & Ham, LLP

(57) ABSTRACT

A bump-on-trace (BOT) structure is described. The BOT structure includes a first work piece with a metal trace on a surface of the first work piece, wherein the metal trace has a first axis. The BOT structure further includes a second work piece with an elongated metal bump, wherein the elongated metal bump has a second axis, wherein the second axis is at a non-zero angle from the first axis. The BOT structure further includes a metal bump, wherein the metal bump electrically connects the metal trace and the elongated metal bump. A package having a BOT structure and a method of forming the BOT structure are also described.

13 Claims, 12 Drawing Sheets

(56) References Cited

U.S. PATENT DOCUMENTS

| | | | |
|---|---|---|---|
| 8,269,345 B2* | 9/2012 | Patel | 257/737 |
| 2088/0088016 | 4/2008 | Ho et al. | |
| 2009/0085203 A1* | 4/2009 | Weissbach et al. | 257/737 |
| 2009/0108443 A1* | 4/2009 | Jiang | 257/737 |
| 2009/0236756 A1* | 9/2009 | Kim et al. | 257/778 |
| 2010/0176510 A1* | 7/2010 | Pendse | 257/737 |
| 2010/0187688 A1 | 7/2010 | Hochstenbach | |
| 2010/0193944 A1 | 8/2010 | Castro et al. | |
| 2011/0074020 A1* | 3/2011 | Yamakami et al. | 257/737 |
| 2011/0248399 A1 | 10/2011 | Pendse | |
| 2011/0260321 A1 | 10/2011 | Pendse | |
| 2011/0285015 A1* | 11/2011 | Song et al. | 257/737 |
| 2012/0032325 A1 | 2/2012 | Miyata et al. | |
| 2012/0146212 A1* | 6/2012 | Daubenspeck et al. | 257/737 |
| 2013/0015574 A1* | 1/2013 | Patel | 257/737 |

\* cited by examiner

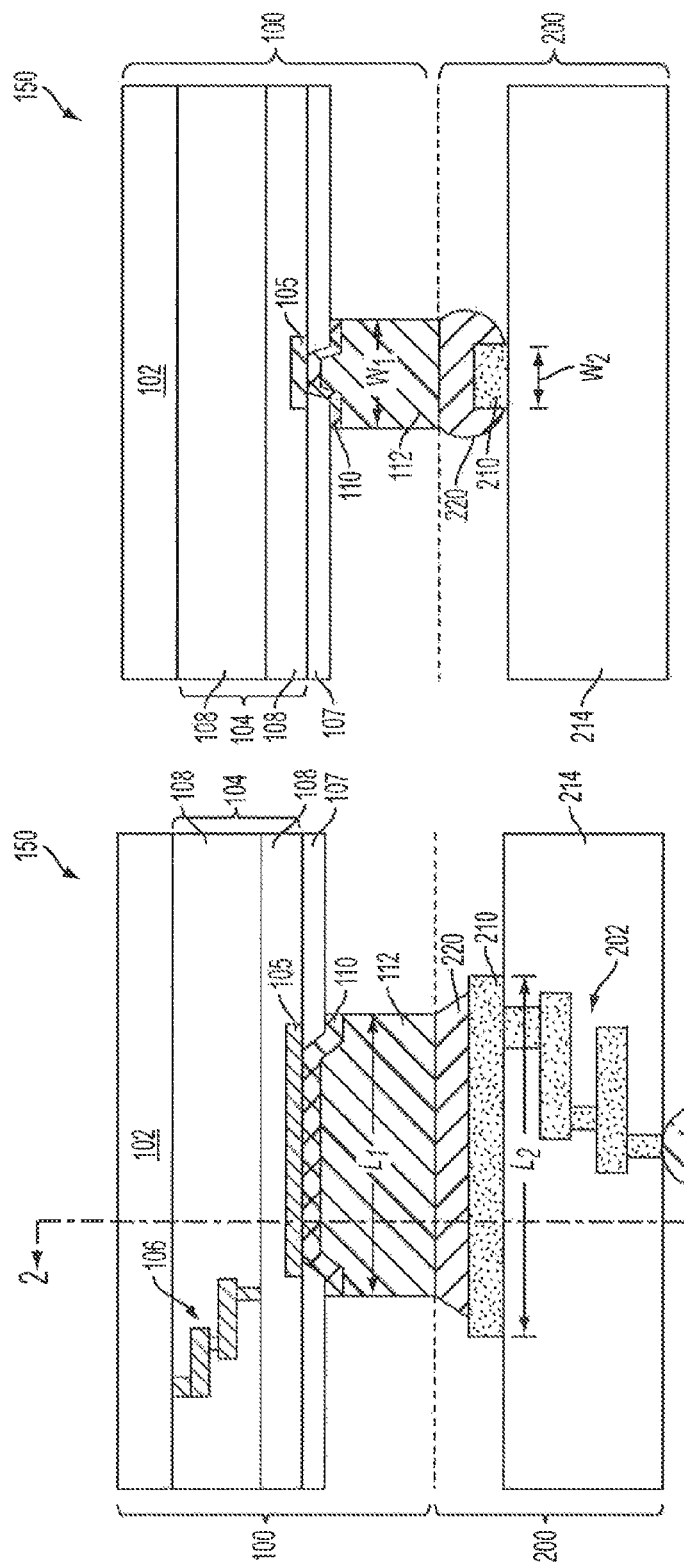

| BOT | LOCATION | DIELECTRIC TOTAL STRESS (MPa) | METAL TRACE PEELING STRESS (MPa) |
|---|---|---|---|
| 251 | A | 110.0 | 129.4 |
| 252 | B | 101.0 | 185.0 |
| 253 | C | 63.1 | 74.8 |
| 254 | D | 60.9 | 86.0 |
| 255 | E | 60.5 | 86.5 |
| 256 | F | 62.8 | 72.6 |

FIG. 2B

| BOT STRUCTURE | 150 | 150' |
|---|---|---|
| NORMALIZED DIELETRIC TOTAL STRESS | 1.00 | 0.68 |
| NORMALIZED DIELETRIC PEELING STRESS | 1.00 | 0.67 |
| NORMALIZED METAL TRACE PEELING STRESS | 1.00 | 0.44 |

FIG. 3E

| BOT | LOCATION | DIELECTRIC TOTAL STRESS (MPa) | METAL TRACE PEELING STRESS (MPa) |
|---|---|---|---|
| 251 | A | 110.0 | 129.4 |
| 251' | A | 74.6 | 77.9 |
| 252 | B | 101.0 | 185.0 |
| 252' | A | 86.5 | 118.8 |

FIG. 4B

BUMP-ON-TRACE (BOT) STRUCTURES

CROSS REFERENCES TO RELATED APPLICATIONS

The present application is a continuation application of U.S. application Ser. No. 13/095,185, entitled "REDUCED-STRESS BUMP-ON-TRACE (BOT) STRUCTURES," filed on Apr. 27, 2011, which is incorporated herein by reference in its entirety.

The present application is related to U.S. application Ser. No. 13/035,586, entitled "EXTENDING METAL TRACES IN BUMP-ON-TRACE STRUCTURES," filed on Feb. 25, 2011, which is incorporated herein by reference in its entirety.

BACKGROUND

Bump-on-Trace (BOT) structures have been used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is relatively low. However, there are technical challenges related to BOT structures.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A and 1B illustrate cross-sectional views of a package structure in accordance with an embodiment.

FIG. 2B shows a table of data comparing the highest stresses in a dielectric layer and the metal trace of each BOT structure of FIG. 2A, in accordance with some embodiments.

FIG. 3E shows a table of normalized stress simulation results comparing two BOT structures, in accordance with some embodiments.

FIG. 4B shows a table of stress simulation results comparing stresses of BOT structures at different locations, in accordance with some embodiments.

DETAILED DESCRIPTION OF ILLUSTRATIVE EMBODIMENTS

Figure 1C:
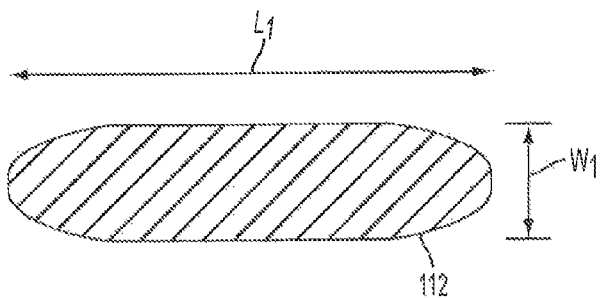
FIG. 1C shows a top view of a copper post, in accordance with some embodiments.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure comprising a Bump-on-Trace (BOT) structure is provided in accordance with an embodiment. The variations of the embodiment are discussed. Throughout the various views and illustrative embodiments, like reference numbers are used to designate like elements.

FIG. 1A illustrates a cross-sectional view of a package structure (or bump-on-trace structure) 150 in accordance with an embodiment. The package structure 150 includes work piece 100 bonded to work piece 200. Work piece 100 may be a device die that includes active devices such as transistors (not shown) therein, although work piece 100 may also be an interposer that does not have active devices therein. In an embodiment wherein work piece 100 is a device die, substrate 102 may be a semiconductor substrate such as a silicon substrate, although it may include other semiconductor materials. Interconnect structure 104, which includes metal lines and vias 106 formed therein and connected to the semiconductor devices, is formed on substrate 102. Metal lines and vias 106 may be formed of copper or copper alloys, and may be formed using damascene processes. Interconnect structure 104 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5.

Work piece 100 may further include under-bump metallurgy (UBM) layer 110 and a copper post 112 on UBM layer 110. Throughout the description, the copper post 112 is also referred to as a copper-containing bump or metal bump. Although copper post 112 is used as an example in the description here and below, other types of metal bumps, such as solder bumps, may also be used in place of copper post 112. The UBM layer 110 is disposed on a metal pad 105, which is part of interconnect structure 104. Between the interconnect structure 104 and the UBM layer 110 not contacting the metal pad 105, there is a passivation layer 107. In some embodiments, the passivation layer 107 is made of polyimide.

Work piece 200 may be a package substrate, although it may be other package components such as interposers, for example. Work piece 200 may include metal lines and vias 202 connecting metal features on opposite sides of work piece 200. In an embodiment, metal trace(s) 210 on the topside of work piece 200 are electrically connected to ball grid array (BGA) balls 212 on the bottom side of work piece 200 through metal lines and vias 202. Metal lines and vias 202 may be formed in dielectric layers 214, although they may also be formed in a semiconductor layer (such as a silicon layer, not shown) and in the dielectric layers that are formed on the semiconductor layer.

Metal trace 210 is formed over a top dielectric layer in dielectric layers 214. Metal trace 210 may be formed of substantially pure copper, aluminum copper, or other metallic materials such as tungsten, nickel, palladium, gold, and/or alloys thereof. FIG. 1A shows that the copper post (or metal bump) 112 has a length of $L_1$, in accordance with some embodiments. FIG. 1A also shows that the metal trace 210 has a length $L_2$, in accordance with some embodiments.

Work pieces 100 and 200 are bonded to each other through solder bump 220, which may be formed of a lead-free solder, a eutectic solder, or the like. Solder bump 220 is bonded to, and contacts, the top surfaces of metal trace 210 and copper post 112, FIG. 1B illustrates a cross-sectional view of the package structure 150 shown in FIG. 1, wherein the cross-sectional view is obtained from the plane crossing line 2-2 in FIG. 1A. As shown in FIG. 1B, solder bumps 220 may also contact the sidewalls of metal trace 210. After the bonding of work pieces 100 and 200, a mold underfill (MUF) (not shown) may be filled into the space between work pieces 100 and 200, in accordance with some embodiments. Accordingly, a MUF may also be filled into the space between neighboring metal traces 210. Alternatively, no MUF is filled, while air fills the space between work pieces 100 and 200, and fills the space between neighboring metal traces 210. FIG. 1B shows that the copper post (or metal bump) 112 has a width of $W_1$, in accordance with some embodiments. FIG. 1B also shows that the metal trace 210 has a width $W_2$, in accordance with some embodiments.

FIG. 1C shows a top view of the copper post 112, in accordance with some embodiments. The copper post 112 has a shape of an oval with a width $W_1$ and a length $L_1$. In some other embodiments, the ratio of $L_1/W_1$ is greater than 1. In some embodiments, the ratio of $L_1/W_1$ is equal to or greater than about 1.2. In some embodiments, the $L_1$ is in a range from about 10 µm to about 1000 µm. In some embodiments, W1 is in a range from about 10 µm to about 700 µm.

Figure 1D:
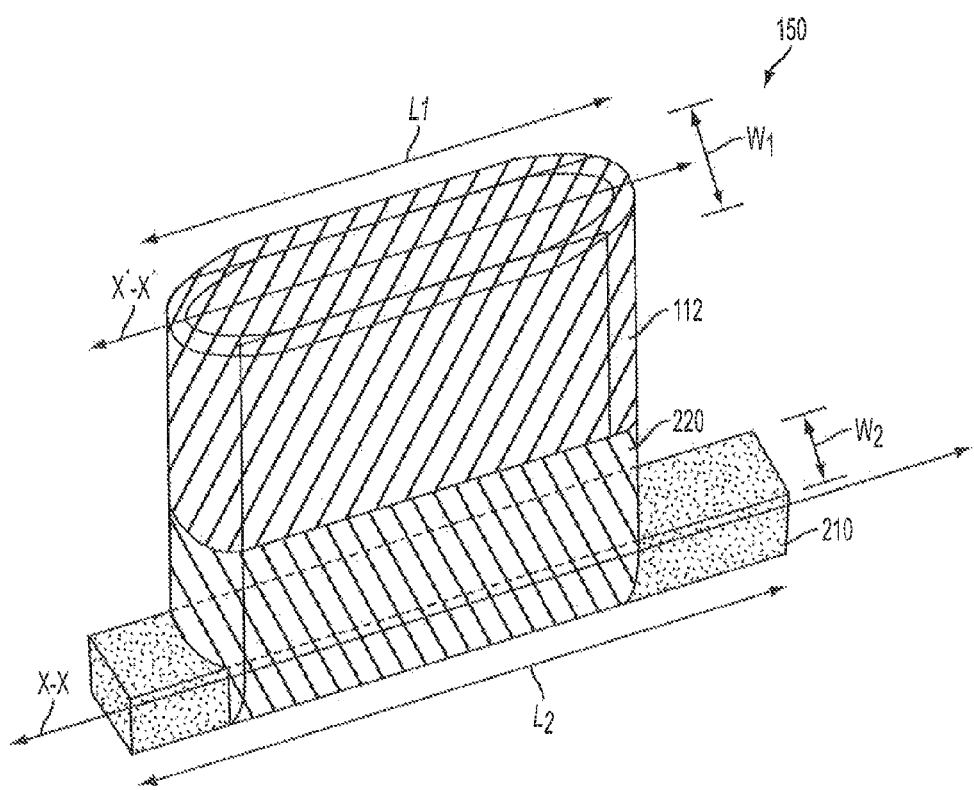
FIG. 1D illustrates an exemplary perspective view of the metal package structure of FIGS. 1A and 1B, in accordance with some embodiments.

FIG. 1D illustrates an exemplary perspective view of metal trace 210, the overlying copper post 112, and solder bump 220, in accordance with some embodiments. The metal trace 210 has a width $W_2$, and a length $L_2$. In some other embodiments, the ratio of $L_2/W_2$ is greater than 1. In some embodiments, the ratio of $L_2/W_2$ is greater than about 1.2. In some embodiments, the $L_2$ is in a range from about 10 µm to about 10,000 µm. In some embodiments, $W_2$ is in a range from about 10 µm to about 500 µm. The structure as shown in FIG. 1D is referred to as being a BOT structure, because solder bump 220 is formed directly on the top surface and sidewalls of metal trace 210, and not on a metal pad that has a width significantly greater than width $W_2$ of metal trace 210. In some embodiments, the ratio of $W_1/W_2$ is in a range from about 0.5 to about 5.

FIG. 1D also shows that the metal trace 210 has an axis line X-X, in accordance with some embodiments. Axis X-X is defined along the length of the metal trace. The copper post 112 has an axis line X'-X', in accordance with some embodiments. Axis X'-X' is defined along the length of the copper post 112. As shown in FIG. 1D, axis X'-X' is substantially parallel to axis X-X. Therefore, the BOT structure 150 of FIG. 1D has an axis X-X. The direction the BOT structures, such as BOT structure 150, point to the center of the die and the relative locations of the BOT structures to the center of the die can affect the stress exerted on the structures.

Figure 1E:
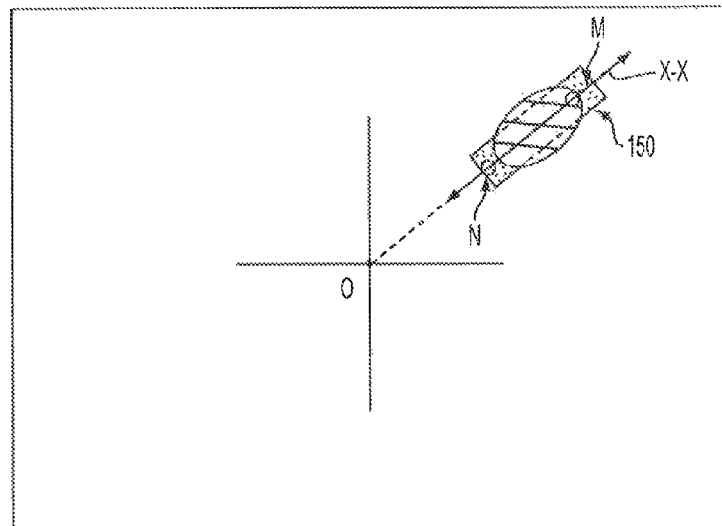
FIG. 1E shows the package structure of FIGS. 1A and 1B with an axis pointing to the center O of a die, in accordance with some embodiments.
Figure 1F:
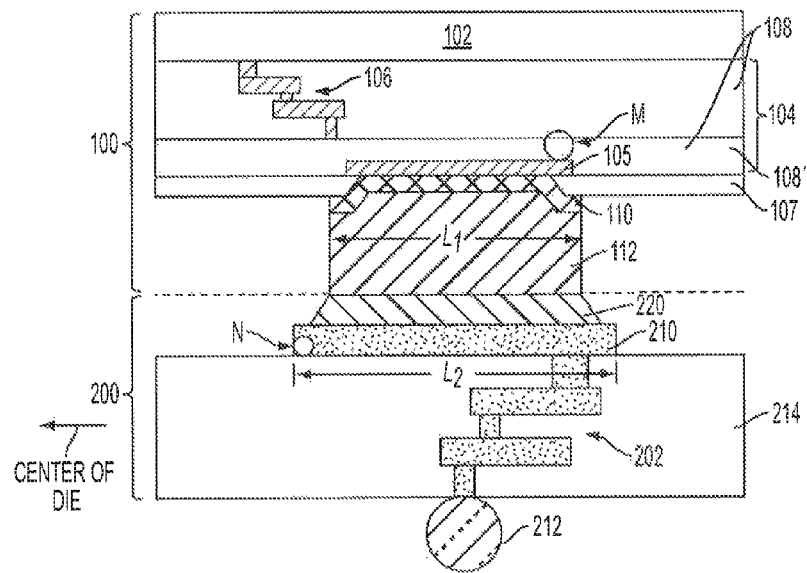
FIG. 1F shows a cross-sectional view of the package structure of FIG. 1E, in accordance with some embodiments.

FIG. 1E shows the BOT structure 150 with the axis X-X pointing to the center O of a die, in accordance with some embodiments. FIG. 1F shows a cross-sectional view of BOT structure 150, in accordance with some embodiments. Stress simulation (or mechanical analysis) results show high stress at location M of the dielectric sub-layer (noted as layer 108' in FIG. 1F), which is a sub-layer of the IMDs 108 and contacts the metal pad 105, as shown in FIGS. 1E and 1F. The stress simulation (or mechanical analysis) is performed by using ANSYS 12.1 simulator, which is made by ANAYS, Inc. of Canonsburg, Pa. As mentioned above, IMDs 108 may comprise low-k dielectric materials, and may have dielectric constants (k values) equal to or lower than about 3.0 or may also be extreme low-k (ELK) dielectric materials having k values equal to or lower than about 2.5. As a result, the dielectric sub-layer 108' contacting the metal pad 105 may be made of a material having a dielectric constant (k value) equal to or lower than about 3.0 or may also be an extreme low-k (ELK) dielectric material having a k value equal to or lower than about 2.5. A porous extreme low-k (ELK) material with a k value of about 2.5 is used in the simulation. The stress of the dielectric sub-layer 108' at location M is highest due to location M being farthest away from the die center "O." Stress simulation results also show high stress at location N of metal trace 210, as shown in FIGS. 1E and 1F. Location N of metal trace 210 is closest to the center of the die.

Figure 2A:
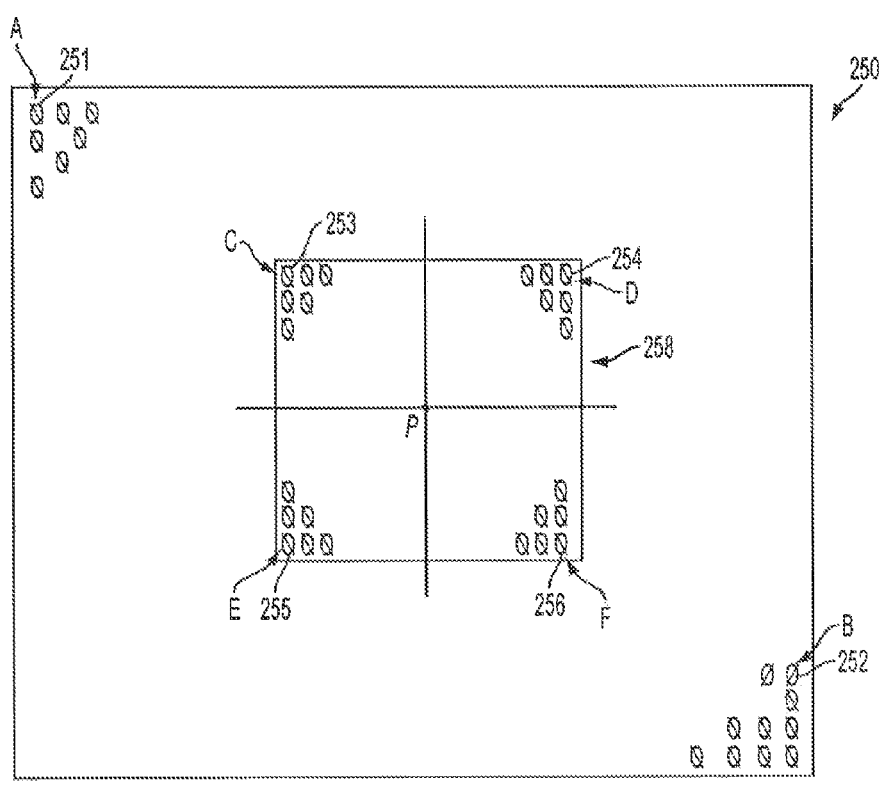
FIG. 2A shows a number of bump-on-trace (BOT) structures on a die, in accordance with some embodiments.

The axis direction and relative position of a BOT structure affects the stress on the BOT structure. For example, if the axis of a BOT structure is pointed perpendicularly to the center of a die, the stresses on the dielectric layer 108' and on metal trace 210 are higher than the stresses of the BOT structure shown in FIG. 1E. FIG. 2A shows BOT structures, 251-256, on a die 250, in accordance with some embodiments. These BOT structures 251-256 all have structures similar to them that are nearby and they are not isolated structures. Further, there are other structures in the remaining areas of die 250 that are not shown in FIG. 2A. BOT structures 251-256 are placed on locations A-F of die 250 respectively. Both locations A and B are placed near two of the far corners of die 250. Locations C-F are placed on 4 corners of a center region 258. The axes of BOT structure 251 at location A, BOT structure 253 at location C, BOT structure 256 at location F all point toward the center P of die 250. In contrast, the axes of BOT structure 252 at location B, BOT structure 254 at location D, and BOT structure 255 at location E are all pointing perpendicularly to the center P of die 250. The BOT structures 251-256 of FIG. 2A are all similar to BOT structure 150 of FIG. 1D with the axes of the metal bumps substantially parallel to the axes of the metal traces.

FIG. 2B shows a table of data comparing the highest stresses in the dielectric layer 108' and the metal trace 201 of each BOT structure of FIG. 2A, in accordance with some embodiments. FIG. 2B shows that the dielectric stress for BOT structure 251 at location A being the highest (110.0 MPa), which is followed by the BOT structure 252 at location B. The highest dielectric stresses of BOT structures 253-256 at locations C-F, which are closer to the center P of die 250 are all smaller than (or about 60% of) the stresses of edge BOT structures 251 and 252. FIG. 2B also shows that stress at the metal trace is highest for BOT structure 252 at corner B (185.0 MPa), which is followed by the stress for BOT structure 251 at location A. Stress of the metal trace of BOT structure 252 at location B is about 40% higher than the stress of the metal trace of BOT structure 251 at location A. Because both structures are placed near the corner edges, the much higher stress is due to the orientation of the BOT structures.

The axis of BOT structure 252 (at location B) is pointed about perpendicularly to the center P of die 250. In contrast, the axis of BOT structure 251 is pointed toward (or about parallel) to the center P of die 250. The different orientations of the axes of these two structures contribute to the significant difference in stresses of metal traces. The data collected in FIG. 2B assume the solder bumps 220 have been reflowed at 250° C. and then cooled to room temperature (25° C.).

The higher stresses on the metal traces of BOT structures with axes pointing in directions substantially perpendicular to the center P of die 250 compared to BOT structures with axes pointing toward the center P of die 250 are also supported by data of structures 253-256 at locations C-F. The axes of BOT structures 254 and 255 at locations D and E respectively point perpendicularly to the center P of die 250. In contrast, the axes of BOT structures 253 and 256 at locations C and F respectively point toward the center P of die 250. The stress results show that the highest stresses on the metal traces of BOT structures 254 and 255 are higher (about 12% higher) than the highest stresses on the metal traces of BOT structures 253 and 256. Therefore, the metal trace stress results of BOT structures 253-256 also support the effect of orientation of axes of BOT structures.

Further, the results in FIG. 2B show that the stresses (both the dielectric stress and stress on metal traces) are higher when the BOT structures are farther away from the die center. The stress results of BOT structures 251 and 252, which are placed at corners farthest from the center P of die 250, are higher than the stress results of BOT structures 253-256, which are placed closer to the center P of die 250 compared to BOT structures 251 and 252. The extreme high stress on metal trace of BOT structure 252 at location B could cause the metal trace, which is similar to metal trace 210 of FIGS. 1A, 1B, 1D and 1F, to be lifted off from the substrate surface (delamination) and to disrupt electrical connection. Similarly, the stress on the metal trace of BOT structure 251 at location A is also quite high and may also cause delamination of the metal trace. Further, the stress at the dielectric layer of BOT structures 251 and 252 are also high relative to the stress at the other BOT structures. High stress at the dielectric layer, which is similar to dielectric layer 108' of FIG. 1F, of BOT structures could also cause interface delamination, which could be a reliability and/or yield issue. Therefore, it's important to seek solutions to reduce stresses at dielectric layer over the metal pad and at metal traces for BOT structures.

Figures 3A, 3B:
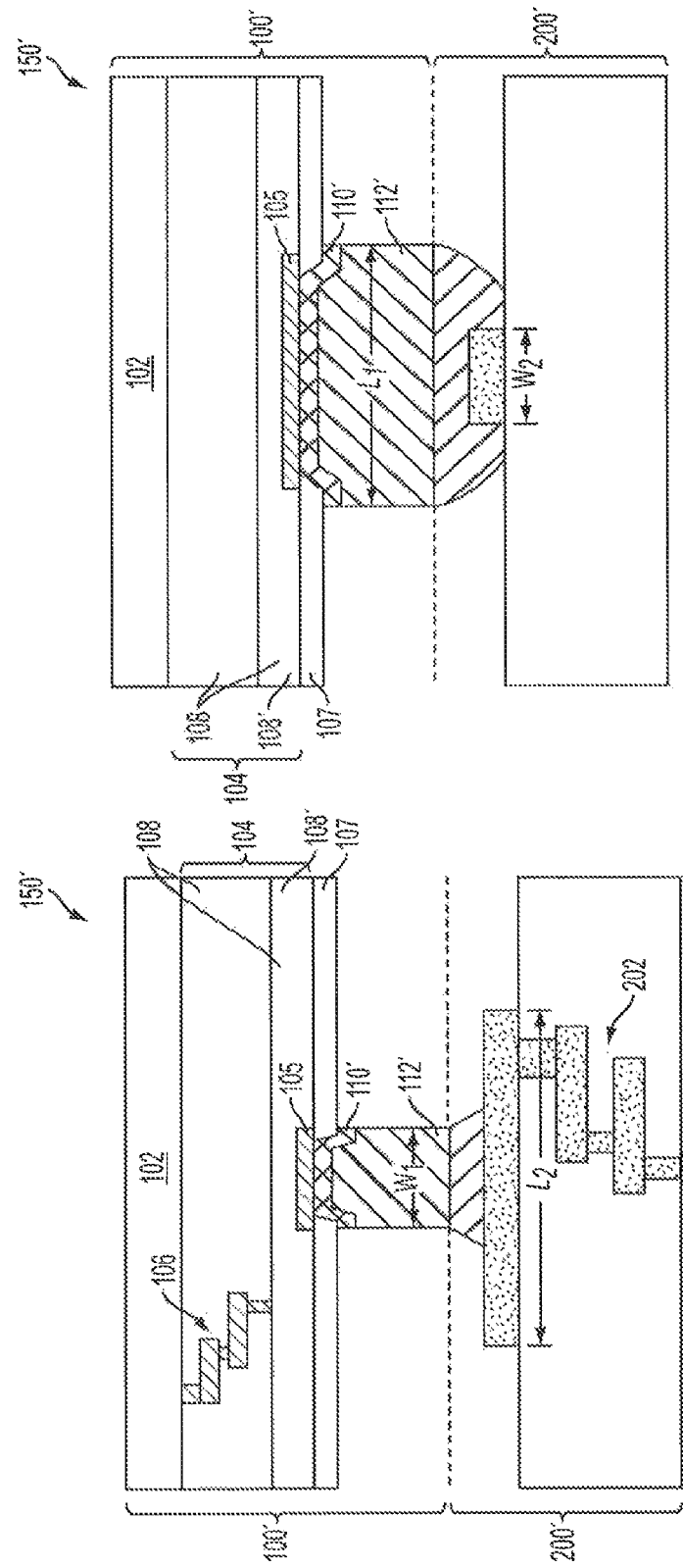
FIGS. 3A and 3B illustrate cross-sectional views of another package structure in accordance with an embodiment.

FIGS. 3A and 3B illustrate cross-sectional views of the package structure 150' in accordance with an embodiment. The substrates 100' and 200' in FIGS. 3A and 3B are similar to substrate 100 and substrate 200 of FIGS. 1A-1D, with the exception that the orientation of the copper post 112', which is similar to copper post 112, and its corresponding UBM layer 110' and solder bump 220'. All are turned 90 degrees (i.e., 90°). Copper post 112' is one type of metal bump. Other types of metal bumps, such as a solder bump, may also be used in place of copper post 112'. FIG. 3A shows that the width $W_1$ of the copper post 112' is in the same direction as the length $L_2$ of the metal trace 210. FIG. 3B shows that the length $L_1$ of the copper post 112' is in the same direction as the width $W_2$ of the metal trace 210.

Figure 3C:
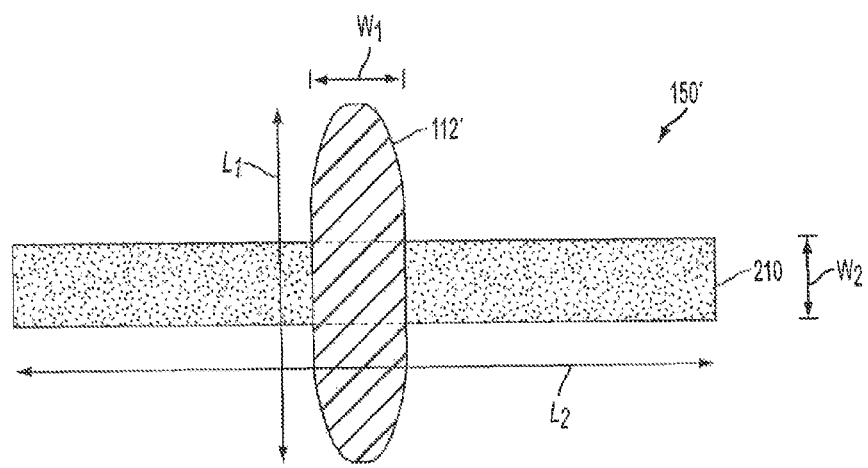
FIG. 3C shows a top view of the BOT structure of FIGS. 3A and 3B, in accordance with some embodiments.
Figure 3D:
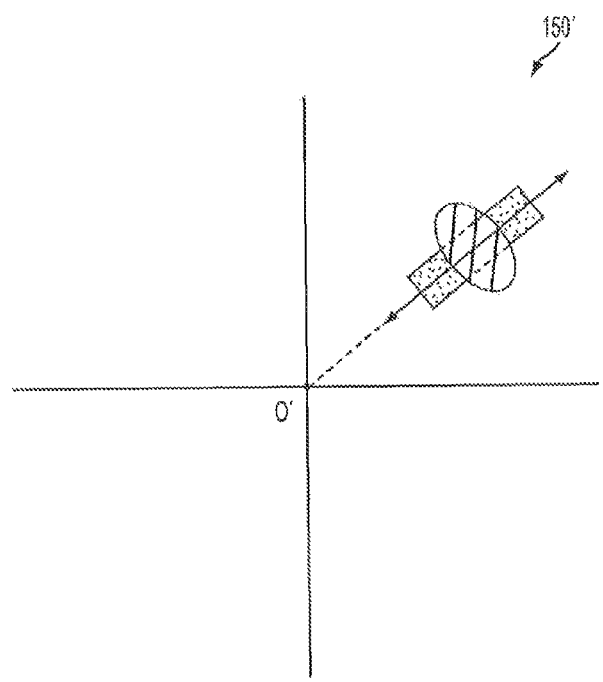
FIG. 3D shows the BOT structure of FIGS. 3A and 3B with an axis of the metal trace pointing to the center of a die, in accordance with some embodiments.

FIG. 3C shows a top view of BOT structure 150', in accordance with some embodiments. The metal trace 210 has a width $W_2$, and a length $L_2$. FIG. 3C shows that the copper post 112', which has a width $W_1$ and a length $L_1$ and an axis Y-Y, is disposed perpendicularly above metal trace 210. Axis Y-Y is substantially perpendicular to axis X-X of metal trace 210. FIG. 3D shows the BOT structure 150' with the axis X-X of the metal trace pointing to the center O' of a die, in accordance with some embodiments. FIG. 3E shows a table of normalized stress simulation results comparing BOT structure 150 of FIGS. 1D-1F and BOT structure 150' of FIGS. 3C-3D, in accordance with some embodiments. The stress results of BOT structure 150 are normalized to be 1 and the stress results of BOT structure 150' are compared against the corresponding stresses of BOT structure 150. The results in FIG. 3E show that the peeling stress and total stress of BOT structure 150' at the dielectric layer 108' are about 32% lower than BOT structure 150. The results also show that the peeling stress of the metal trace 210 for BOT structure 150' is lower than the BOT structure 150 by about 56%. The simulation results show a drastic reduction in stresses at the dielectric layer and at the metal trace. As mentioned above, high stress at the metal trace can cause poor or no electrical contact and reduce yield. In addition, high stress at the dielectric layer 108' can result in reliability issue, which can also degrade yield. By orienting the axis of the copper post 112 to be perpendicular to the axis of the metal trace 210, the maximum stresses at the dielectric layer 108' and metal trace 120 can be significantly reduced.

Figure 4A:
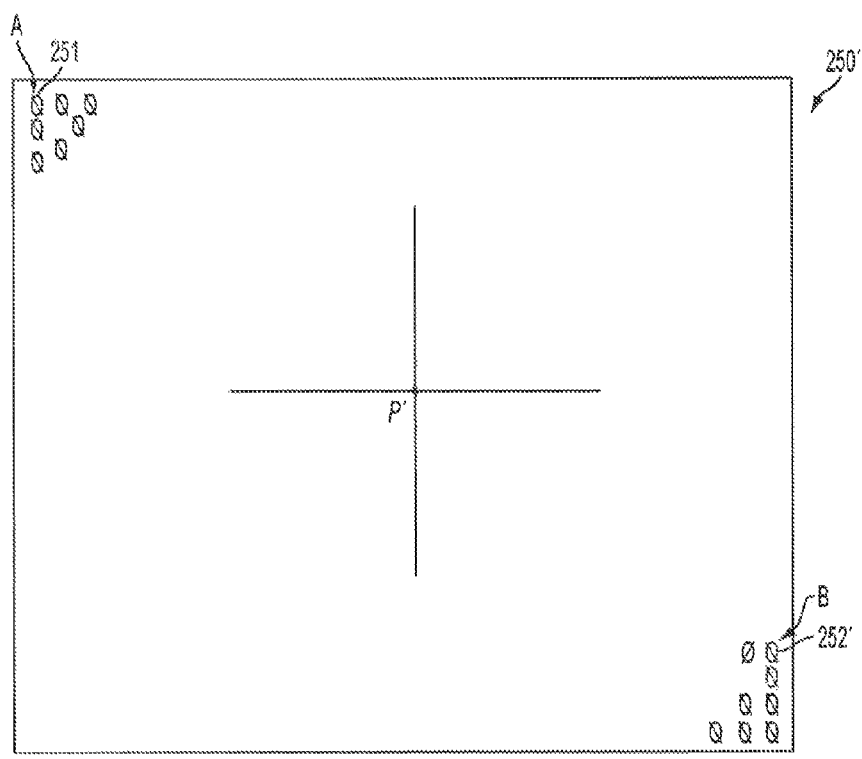
FIG. 4A shows 2 BOT structures on two locations on a die, in accordance with some embodiments.

FIG. 4A shows 2 BOT structures, 251' on location A' and 252' on location B', on a die 250', in accordance with some embodiments. These 2 BOT structures 251', 252', and locations A', B' are similar to structures 251, 252, and locations A, B of FIG. 2A respectively, with the exception that the metal bumps of BOT structures 251' and 252' are oriented to be perpendicular to the metal traces of these two BOT structures and also the metal trace of BOT structure 252' is reoriented toward the center P' of die 250'. FIG. 4B shows a table of stress simulation results comparing stresses of structures 251', 252', 251, and 252, in accordance with some embodiments. The results show an about 30% reduction in dielectric stress and an about 40% reduction stress in metal stress for BOT structure 251' at location A' compared to BOT structure 251 at location A. The reduction is attributed to the change in the orientation of the metal bump, such as copper post 112, from being parallel to being perpendicular to the metal trace. The results also show an about 14% reduction in dielectric stress and an about 35% reduction stress in metal stress for BOT structure 252' at location B' compared to BOT structure 252 at location B. The reduction is attributed to the change in the orientation metal trace pointing toward the center P' of die 250' and the metal bump, such as copper post 112, being changed from being parallel to being perpendicular to the metal trace.

The results in FIGS. 3E and 4B indicate significant benefits in stress reduction by placing the metal bumps perpendicularly to the underlying metal trace and also by pointing the axes of metal traces toward the center of die. Such arrangement is especially needed for BOT structures near the edges or corners of the die, such as structures 251 and 252, which have higher stress and are more likely to delaminate or have reliability issues. The BOT structures 251-256 and 251'-252' are all structures surrounded by other similar structures. Isolated bump structures and BOT structures are known to have higher stresses, compared to structures surrounded by other structures. Therefore, isolated structures can also benefit from the BOT structure design described above.

One potential downside of such BOT design is the larger surface area (or real-estate) required. With the lengthy side of the copper post (or metal bump), such as copper post 112, instead of the narrower width of the copper post, being perpendicular to the metal trace (210), additional space (or surface area) is needed. Therefore, such design requires additional surface area. If higher density of BOT structures is needed, the design can be applied on BOT structures that are most at risk of delamination or reliability issues. For examples, BOT structures near the edge of the die or isolated BOT structures have higher stresses than other BOT structures.

Figure 5A:
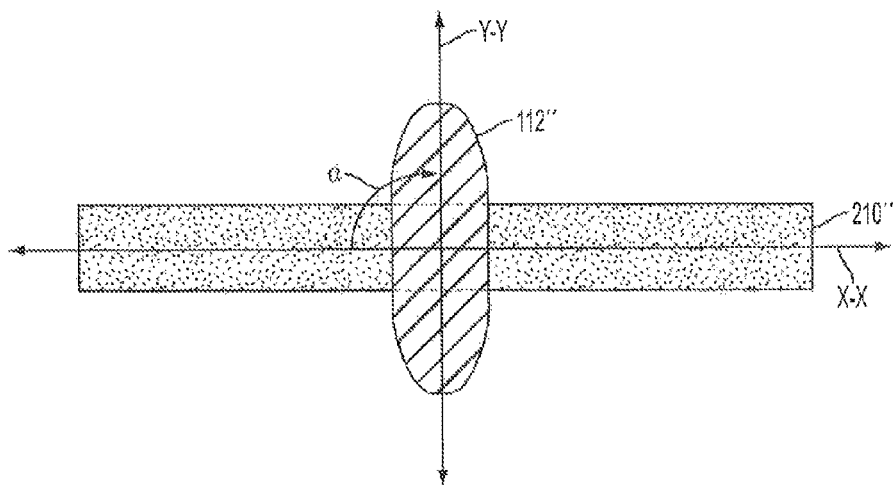
FIG. 5A shows a metal bump with an axis at an angle with the axis of a metal trace, in accordance with some embodiments.

The new BOT structures described FIGS. 3A-3D show that the axis of the copper post 112' is substantially perpendicular to the axis the metal trace 210'. In some embodiments, the length $L_1$ of copper post 112' is evenly divided on metal trace 210' (or the center of copper post 112' is aligned with the axis of metal trace 210'. However, the axis of the copper post 112' does not need to be substantially perpendicular to the axis of the metal trace 210' to reduce the stress. FIG. 5A shows a top view of a copper post 112" over a metal trace 210". As described above, the copper post 112" is at an angle "α" of about 90°, as shown in FIG. 5A in accordance with some embodiments. In some embodiments, the angle "α" is in a range from about 30° to about 150°. In some embodiments, the angle "α" is in a range from about 45° to about 135°. In some other embodiments, the angle "α" is in a range from about 60° to about 120°.

Figure 5B:
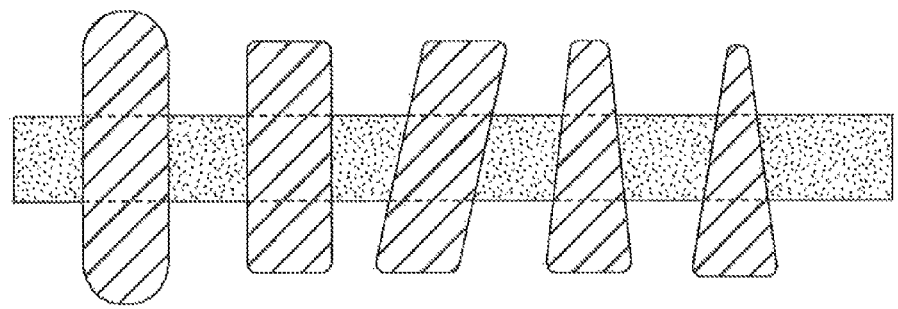
FIG. 5B shows examples of different shapes of elongated metal bumps over a metal trace, in accordance with some embodiments.

The BOT structures described above show that the top view of the metal bumps and their associated UBM layers are in the shape of an oval. Alternatively, the top view of the metal bumps can be in other elongated shapes, such as a track-field-shaped oval (an oval with two parallel sides), a rectangle, a parallelogram, a trapezoid, or a triangle, etc, as shown in FIG. 5B in accordance with some embodiments. In some embodiments, the corners of the metal bumps are rounded to reduce stress. Any elongated metal bumps could have the benefit of lowering stresses by placing the long axis not-parallel to the axis of metal trace.

Figure 6:
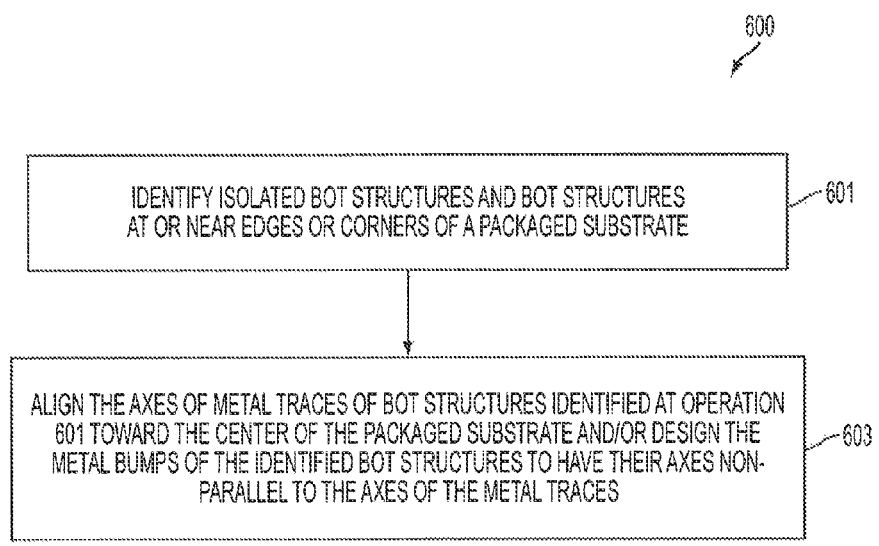
FIG. 6 shows a process flow of reducing stresses of BOT structures on a packaged substrate, in accordance with some embodiments.

FIG. 6 shows a process flow 600 of reducing stresses of BOT structures on a packaged substrate, in accordance with some embodiments. The package substrate is a packaged die. At operation 601, isolated BOT structures and BOT structures at and/or near the edges or corners of the packaged substrate are identified. Such BOT structures have high delamination risks due to high stress at the metal trace interface and the dielectric interface with the metal pad. At operation 603, the axes of metal traces of the BOT structures identified in operation 601 are aligned to point toward the center of the package structure (or packaged die) and/or the metal bumps of these BOT structures are designed to have their axes non-parallel to the axes of the metal traces on which they are placed. In some embodiments, the axes of the metal bumps are substantially perpendicular to the axes of the metal traces to reduce the stresses of the BOT structures.

The embodiments of bump-on-trace (BOT) structures and their layout on a die described above reduce stresses on the dielectric layer on the metal pad and on the metal traces of the BOT structures. By orienting the axes of the metal bumps in non-parallel relation to the metal traces, the stresses can be reduced, which can reduce the risk of delamination of the metal traces from the substrate and the dielectric layer from the metal pad. Further, the stresses of the dielectric layer on the metal pad and on the metal traces may also be reduced by orienting the axes of the metal traces toward the center of the die. As a result, the yield can be increased.

In accordance with some embodiments, a bump-on-trace (BOT) structure is provided. The BOT structure includes a first work piece with a metal trace on a surface of the first work piece, wherein the metal trace has a first axis. The BOT structure further includes a second work piece with an elongated metal bump, wherein the elongated metal bump has a second axis, wherein the second axis is at a non-zero angle from the first axis. The BOT structure further includes a metal bump, wherein the metal bump electrically connects the metal trace and the elongated metal bump.

In accordance with some other embodiments, a packaged substrate with a bump-on-trace (BOT) structure is provided. The package includes a first work piece with a metal trace on a surface of the first work piece, wherein the metal trace has a first axis. The package further includes a second work piece with a plurality of elongated bumps, wherein at least one of the plurality of elongated metal bumps has a second axis and at least another of the plurality of elongated metal bumps has a third axis, wherein the second and the third axes are not the same and the second axis is at a non-zero angle from the first axis. The package further includes a plurality of metal bumps electrically connecting the plurality of elongated bumps and the metal trace.

In accordance with yet other embodiments, a method of forming a bump-on-trace (BOT) structure is provided. The method includes forming a metal trace on a first work piece, wherein the metal trace has a first axis. The method further includes forming an elongated metal bump on a second work piece, wherein the elongated metal bump has a second axis, wherein the second axis is at a non-zero angle from the first axis. The method further includes electrically connecting the metal trace with the elongated metal bump using a metal bump.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A bump-on-trace (BOT) structure comprising:
a first work piece with a metal trace on a surface of the first work piece, wherein the metal trace has a first axis, wherein the first work piece is rigid, and an entirety of the metal trace is on the first work piece;
a second work piece with an elongated metal bump, wherein the elongated metal bump has a second axis, wherein the second axis is at a non-zero angle from the first axis; and
a metal bump, wherein the metal bump electrically connects the metal trace and the elongated metal bump.

2. The BOT structure of claim 1, wherein the elongated metal bump has a first length extending in a first direction, the first length ranging from 10 microns (μm) to 1,000 μm.

3. The BOT structure of claim 2, wherein the metal trace has a second length extending in a second direction, different from the first direction, the second length ranging from 10 μm to 10,000 μm.

4. The BOT structure of claim 2, wherein the elongated metal bump has a first width extending in a second direction, different from the first direction, the first width ranging from 10 μm to 700 μm.

5. The BOT structure of claim 2, wherein the metal trace has a second width extending in the first direction, the width ranging from 10 μm to 500 μm.

6. The BOT structure of claim 1, wherein an angle between the first axis and the second axis ranges from 60-degrees to 120-degrees.

7. The BOT structure of claim 1, wherein the elongate metal bump has a first half length extending beyond a first edge of the metal trace and a second half length extending beyond a second opposite edge of the metal trace, wherein the first half length is equal to the second half length.

8. The BOT structure of claim 1, wherein the second work piece is an interposer.

9. The BOT structure of claim 1, wherein the first work piece and the second work piece comprise active devices.

10. A method of making a bump-on-trace (BOT) structure, the method comprising:

forming a metal trace on a first work piece, wherein the metal trace has a first axis, the metal trace is formed completely on the first work piece, and the first work piece is rigid;

forming an elongated metal bump on a second work piece, wherein the elongated metal bump has a second axis, wherein the second axis is at a non-zero angle from the first axis; and electrically connecting the metal trace with the elongated metal bump using a metal bump.

11. The method of claim 10, wherein forming the elongated metal bump comprises forming the elongate metal bump to have the second axis at an angle with the first axis, the angle ranging from 60-degrees to 120-degrees.

12. The method of claim 10, further comprising filling a space between the first work piece and the second work piece with a mold underfill.

13. The method of claim 10, wherein electrically connecting metal trace with the elongated metal bump comprises reflowing a solder bump.

* * * * *